United States Patent
Buskmiller et al.

(10) Patent No.: US 6,284,970 B1
(45) Date of Patent: Sep. 4, 2001

(54) ELECTROMAGNETIC INTERFERENCE COVER FOR AN ELECTRONICS MODULE AND AN ELECTRONIC EQUIPMENT CHASSIS EMPLOYING THE SAME

(75) Inventors: Michael R. Buskmiller, Dallas; Vincent M. Byrne, Mesquite; Edward C. Fontana, Rockwall; Dan Kolides, Mesquite; Yehoshua Mandelcorn, Dallas, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/395,041

(22) Filed: Sep. 13, 1999

(51) Int. Cl.[7] .................................................. H05K 9/00
(52) U.S. Cl. ................... 174/35 GC; 361/800; 361/752; 361/796; 361/797
(58) Field of Search ............................ 174/35 R, 35 MS, 174/35 GC; 361/816, 818, 799, 800, 796, 797, 752, 753

(56) References Cited

U.S. PATENT DOCUMENTS 5,980,275 * 11/1999 Beaman et al. ........................ 439/92
6,143,979 * 11/2000 Millard ............................ 174/35 GC

* cited by examiner

Primary Examiner—Dean A. Reichard
Assistant Examiner—Hung V Ngo

(57) ABSTRACT

The present invention provides an electromagnetic interference (EMI) module cover for use in an electronics module that is configured to house electrical components that are capable of generating electromagnetic emissions that cause EMI. In one embodiment a conductive sidepanel has a resilient cantilever member formed therefrom with a fixed end that is integrally formed with the sidepanel and a movable end that is free of a module coupler, thereby allowing the resilient cantilever member to flex as the module is installed in a chassis. The resilient cantilever member has a boss that is formed proximate to the movable free end. The boss extends outward from the sidepanel a distance sufficient to provide a conductive path between the conductive sidepanel and an adjacent conductive surface when the module is installed in the chassis.

6 Claims, 4 Drawing Sheets

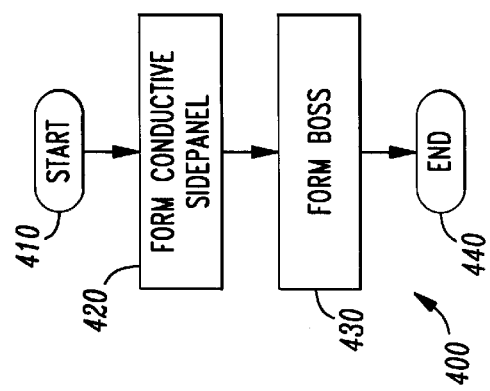
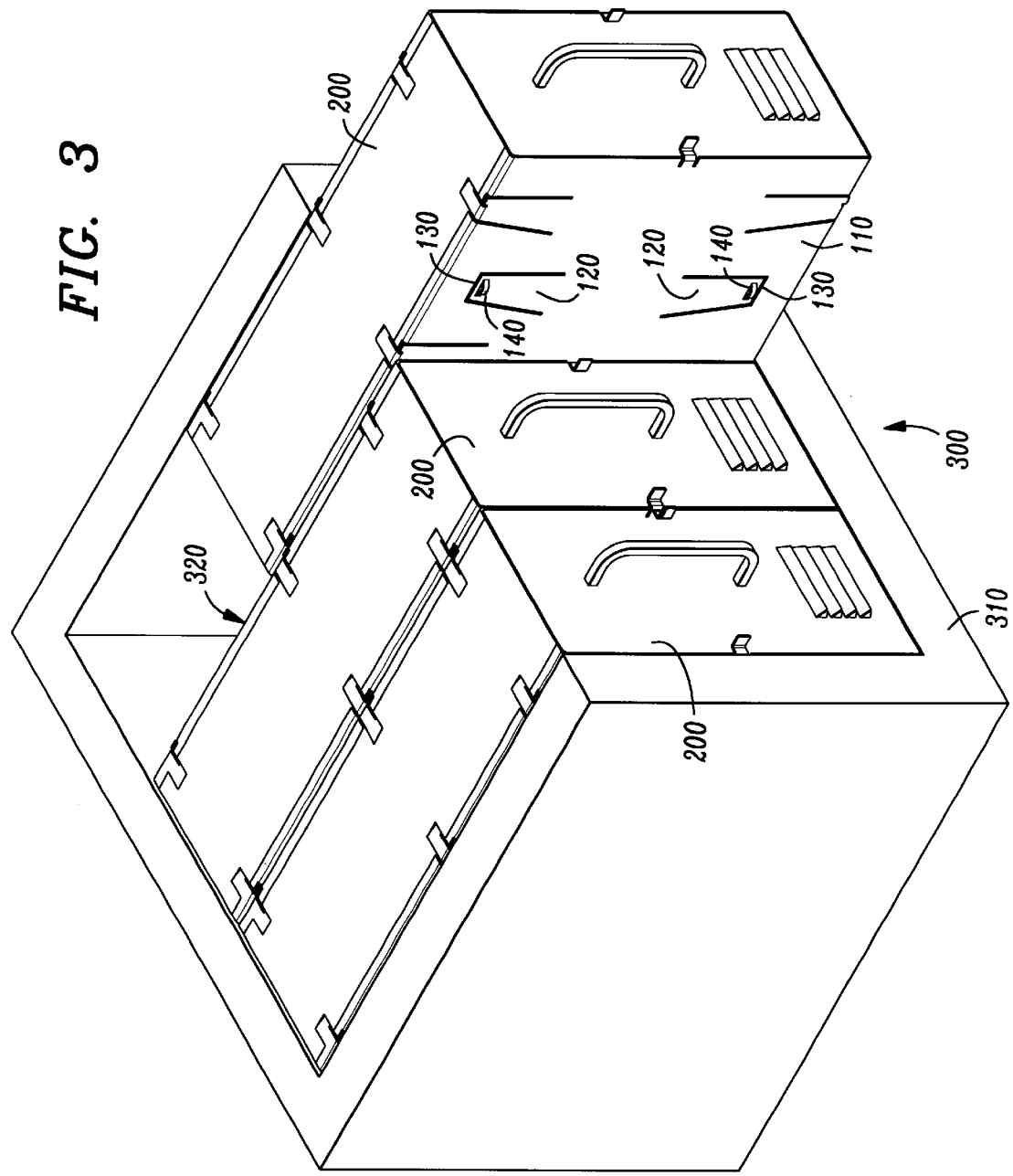

ELECTROMAGNETIC INTERFERENCE COVER FOR AN ELECTRONICS MODULE AND AN ELECTRONIC EQUIPMENT CHASSIS EMPLOYING THE SAME

TECHNICAL FIELD OF THE INVENTION

The present invention is directed, in general, to electronic equipment systems and, more specifically, to an electromagnetic interference (EMI) cover for an electronics module, a method of manufacturing an EMI cover and an electronic equipment chassis employing the same.

BACKGROUND OF THE INVENTION

Electronic equipment in the telecommunications and other industries is generally designed based upon a modular format. The modular subassemblies that combine to make up an electronic assembly are generally housed in a chassis that has multiple racks with modular compartments.

The modular design provides several advantages including reliability, ease of maintenance and economic savings. For example, if a module in the electronic assembly malfunctions, a service technician can remove and replace the malfunctioning module without taking the system employing the module out of service. If necessary, the malfunctioning module can then be repaired at a service location by specialized technicians familiar with that type of module. This permits field maintenance to be carried out by less skilled personnel and also results in a more reliable system.

The type of chassis used to accommodate the modules varies depending on the environment where the equipment is located. One type of chassis commonly used in the telecommunications business has a series of modules installed adjacent to one another. This type of chassis is commonly employed, for example, to house rectifier modules that combine to make up a rectifier assembly.

Regardless of the type of electronic equipment the chassis assembly accommodates, the chassis is used to provide the framework to deliver electrical power to or from the modules and provide for electrical connectivity between modules. Because of the type of electrical components that have to be used in rectifiers or converters, power supply modules are generally of the type that will generate electromagnetic emissions that can cause interference with other nearby electronic devices. For this reason, the various regulatory agencies will generally specify a maximum level of EMI emission that a power system is permitted to radiate. Because of this, one of the major concerns of manufacturers and users of telecommunications power systems is the level of EMI emission of such a system.

One method of controlling radiated EMI emissions in a modular electronic assembly is the establishment of low impedance connections to provide a common voltage potential between a chassis and the various modules housed in the chassis. By providing a common ground voltage potential, the radiated EMI generated by differing voltages is reduced.

One prior art method of providing a common grounding voltage between each conductive case in a chassis is to couple each module to the chassis with a separate wire. This approach, however, exhibits characteristic impedances that are too high to be effective for efficient EMI control. Another conventional method employs a conductive, compliant gasketing material. However the use of gasketing materials adds to both materials and labor costs and are therefore undesirable. Another EMI control method is to provide for a direct contact between the chassis and the module cases and between cases of adjacent modules. However, even in situations where a common voltage potential can be established between module cases and the chassis or between adjacent module cases by direct contact, the degree of design tolerance necessary to provide for a direct connection common path for the modular case to the chassis or between adjacent module cases generally increases the total manufacturing cost and decreases reliability.

Accordingly, what is needed in the art is a device that is employable in an electronic equipment chassis that can establish a common voltage potential between the electronic modules and the chassis housing the modules to provide an assured grounding connection that reduces EMI emissions to an acceptable level.

SUMMARY OF THE INVENTION

To address the above discussed deficiencies of the prior art, the present invention provides an electromagnetic interference (EMI) module cover for use in an electronic module that is configured to house electrical components capable of generating such EMI emissions. In one embodiment, a conductive sidepanel has a resilient cantilever member formed therefrom with a fixed end that is integrally formed with the sidepanel and a movable end that is free of a module coupler. This configuration allows the resilient cantilever member to flex as the module is installed in a chassis. The resilient cantilever member has a boss that is formed proximate the movable free end. The boss extends outward from the sidepanel a distance sufficient to provide a conductive path between the conductive sidepanel and an adjacent conductive surface when the module is installed in the chassis.

Thus, in a broad scope, the present invention provides an EMI module cover that provides a positive contact to assure a conductive path between the electronic module and the chassis in which it resides. This positive contact equalizes voltage potentials between the module and the chassis and, thereby, reduces EMI emissions.

One embodiment of the present invention provides that the EMI module cover have a sidepanel with a plurality of resilient cantilever members. An aspect of this embodiment provides for at least one of the resilient cantilever members to have an asymmetrical orientation to at least one other of the resilient cantilever members. Another embodiment provides for an EMI module cover having a sidepanel with two resilient cantilever members that are located on opposing ends of the sidepanel.

In one useful embodiment of an EMI module cover, the invention provides for that the resilient cantilever member be formed within the perimeter of the sidepanel. This feature assures contact between the boss on the cantilever member and an adjacent conductive sidepanel by reducing the possibility of interference from fasteners or other protuberances along the edges of the module.

In yet another embodiment, the sidepanel of the EMI module cover has a cantilever member with a fixed end that is integrally formed from the sidepanel and a movable end with a module coupler. In this embodiment, the module coupler on the movable end is used to interconnect with another panel in forming an exterior cover or housing for the module. When the module coupler is engaged by a cooperating panel, the cantilever member is fixed and is no longer resilient.

In yet another embodiment of the invention, an electronics module is configured to be received within a frame of an electronics chassis. This module has an electrical components housing with interlocking opposing sidewalls, at least one of which is an EMI module cover of the type described above. Another aspect of the invention provide for an electronics equipment chassis, consisting of a frame and an electronics module configured to be received within the frame, where the module has an EMI cover with a conductive sidepanel as described above.

The present invention also provides for a method of manufacturing an EMI module cover for use on an electronics module configured to house electrical components capable of EMI emissions. The method, in one embodiment, comprises forming a conductive sidepanel having a resilient cantilever member integrally formed therefrom. The resilient cantilever member is formed with its movable end free from a module coupler, so that the resilient cantilever member can flex as the module is installed in a chassis and provide conductive contact with the chassis after installation. Proximate the movable end, a boss is formed that extends outward from the sidepanel a sufficient distance so that a conductive path between the conductive sidepanel and an adjacent conductive surface is provided.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3 illustrates an isometric view of an electronics chassis configured to receive three electronics modules illustrated in FIG. 2 where each of the modules has an embodiment of the EMI covered by the invention; and FIG. 4 illustrates an embodiment of a method of manufacturing an EMI cover.

DETAILED DESCRIPTION

Figure 1A:
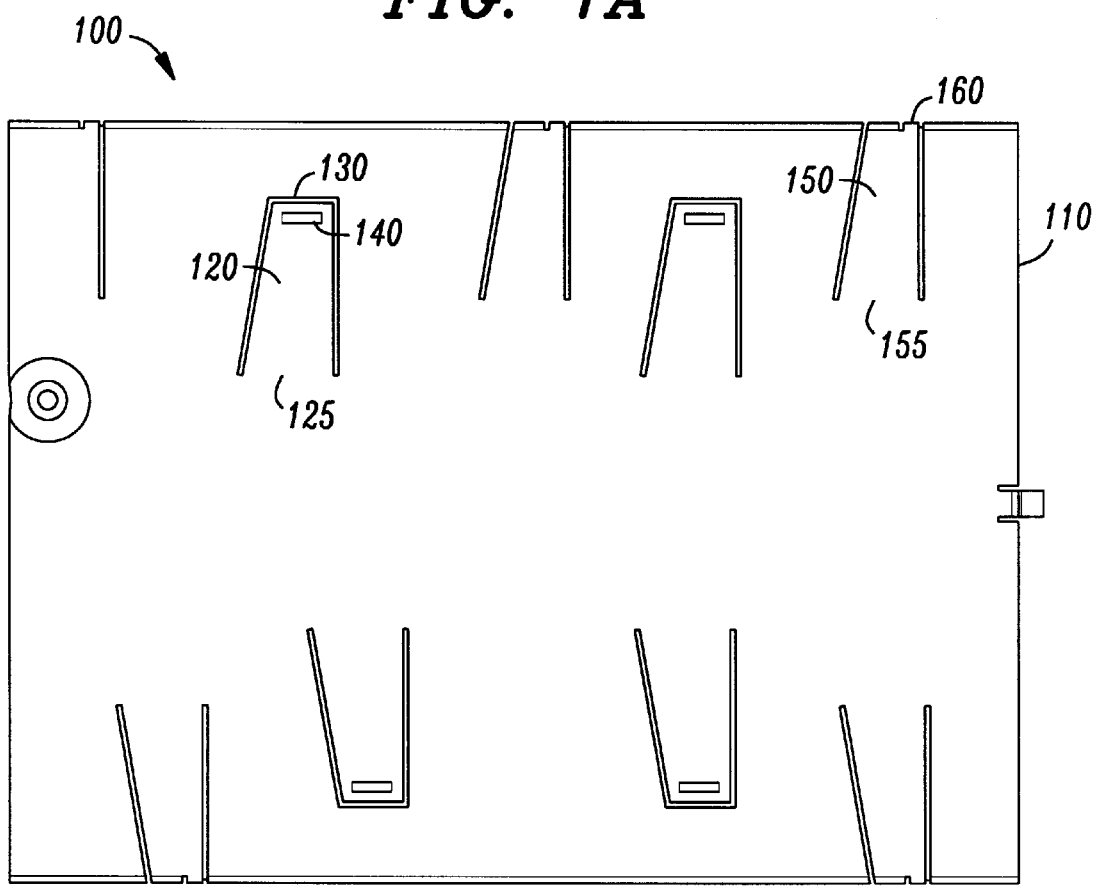
FIG. 1A illustrates a an elevational side view of one embodiment of an EMI module cover constructed in accordance with the present invention.
Figure 1B:
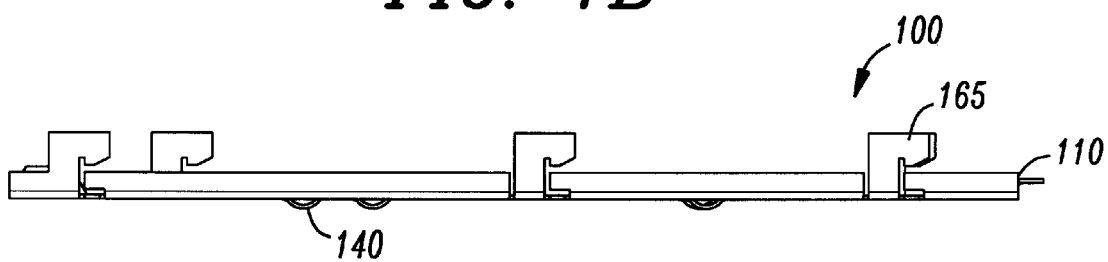
FIG. 1B illustrates top planar view of the EMI cover illustrated in FIG. 1A.
Figure 1C:
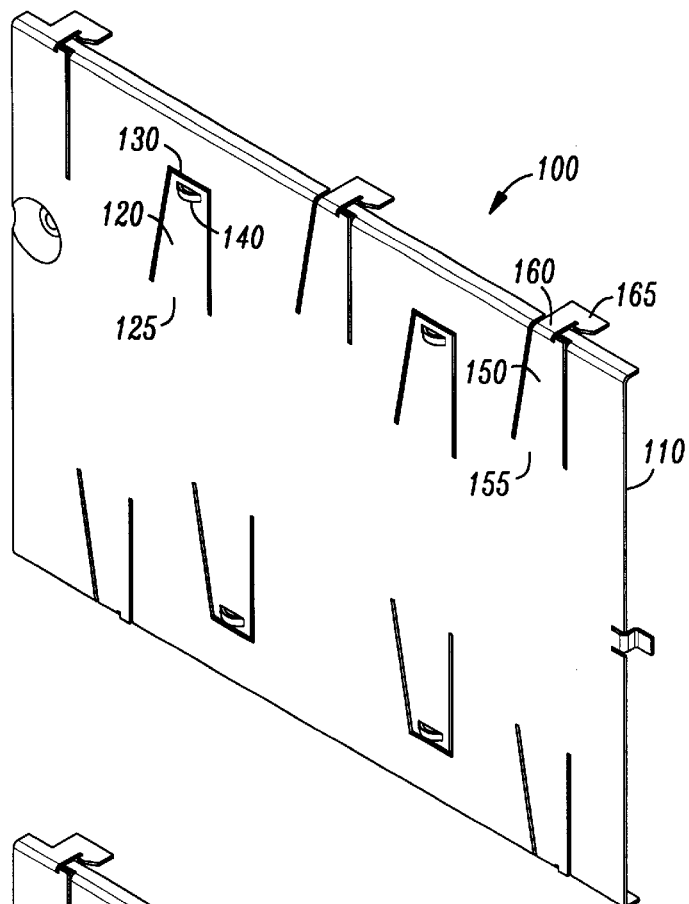
FIG. 1C illustrates an isometric view of the embodiment of an EMI panel illustrated in FIG. 1A.

Referring initially to FIGS. 1A–1C, illustrated are three different views of an embodiment of an EMI module cover 100 constructed in accordance with the present invention.

Illustrated in FIG. 1A is an elevational side view of the EMI cover 100. FIG. 1B illustrates a top planar view of the EMI cover 100 illustrated in FIG. 1A. Illustrated in FIG. 1C is an isometric view of the EMI cover 100. These three figures will be used to explain certain exemplary embodiments of the present invention.

The EMI cover illustrated in FIG. 1A, has a sidepanel 110 with a flexible cantilever member 120 formed therefrom. The cantilever member 120 has a fixed end 125 that is integrally formed with the sidepanel 110 and a movable end 130. Proximate the movable end 130, is a boss 140 that extends outward from the sidepanel 110. The boss 140 extends outward a sufficient distance to provide a conductive path between the sidepanel 110 and an adjacent conductive surface when a module with the EMI module cover 100 is installed in a chassis. The outward extension of the boss 140 from the sidepanel 110 can be clearly seen in FIG. 1B. Of course, if design so dictates, the sidepanel 110 may include a plurality of such cantilever members 150 as illustrated in FIG. 1A.

Figure 2:
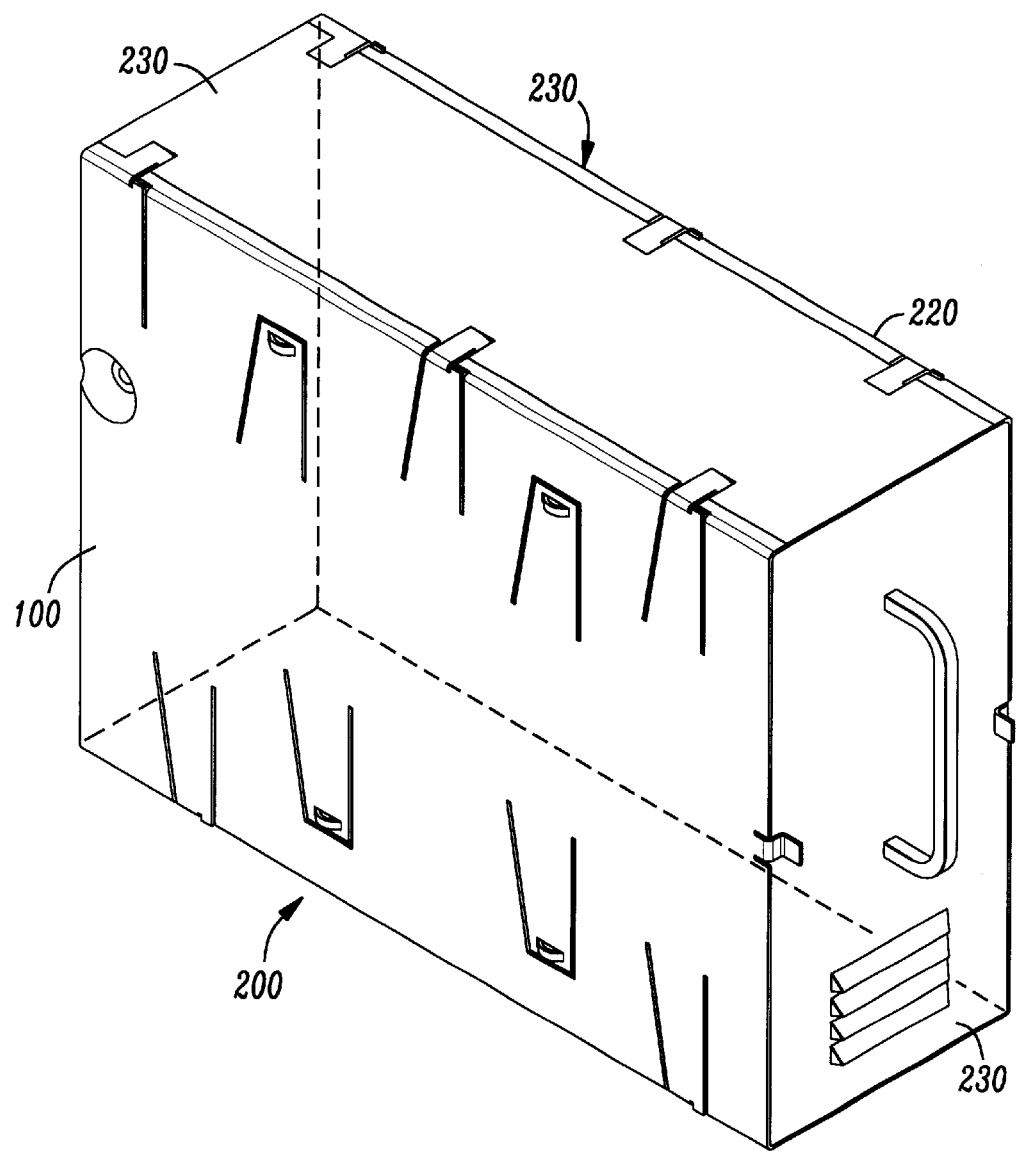
FIG. 2 illustrates an isometric view of an electronics module with an embodiment of an EMI cover covered by the invention that is configured to be received within the framework of a chassis.

In the illustrated embodiments, the sidepanel 110 has additional cantilever members 150 integrally formed with the sidepanel 110 with a module coupler 165 on a movable end 160, which are designed to engage corresponding module couplers of other sidepanel members and cooperatively form a module cover or housing as shown in FIG. 2. The module coupler 165 is clearly visible in FIGS. 1B and 1C. These cantilever members 150 are similar to the resilient cantilever members 120 with respect to a fixed end 155 being integrally formed with the sidepanel 110. The functional distinction between the two types of cantilever members 120, 150, however, is the module coupler 165. When the module coupler 165 is used to secure the EMI module cover 100 to another module cover, the cantilever member 150 is fixed into position and is no longer resilient. The resilient cantilever member 120, on the other hand, retains its resiliency. This continuing resiliency assures that a conductive path will be maintained between the sidepanel 110 and an adjacent conductive surface because the resilient cantilever member 150 will be flexible enough to force the outwardly extended bosses 140 against the adjacent conductive surface when the module is installed in a chassis.

In one embodiment of the invention, the sidepanel 110 has a plurality of resilient cantilever members 120 on it. One aspect of this embodiment provides for at least one of the resilient cantilever members 120 to have an asymmetrical orientation to at least one other resilient cantilever member 120. In still another embodiment, the resilient cantilever members 120 are formed within the perimeter of the sidepanel 110. All of these embodiments are illustrated in FIGS. 1A–1C.

Figure 1D:
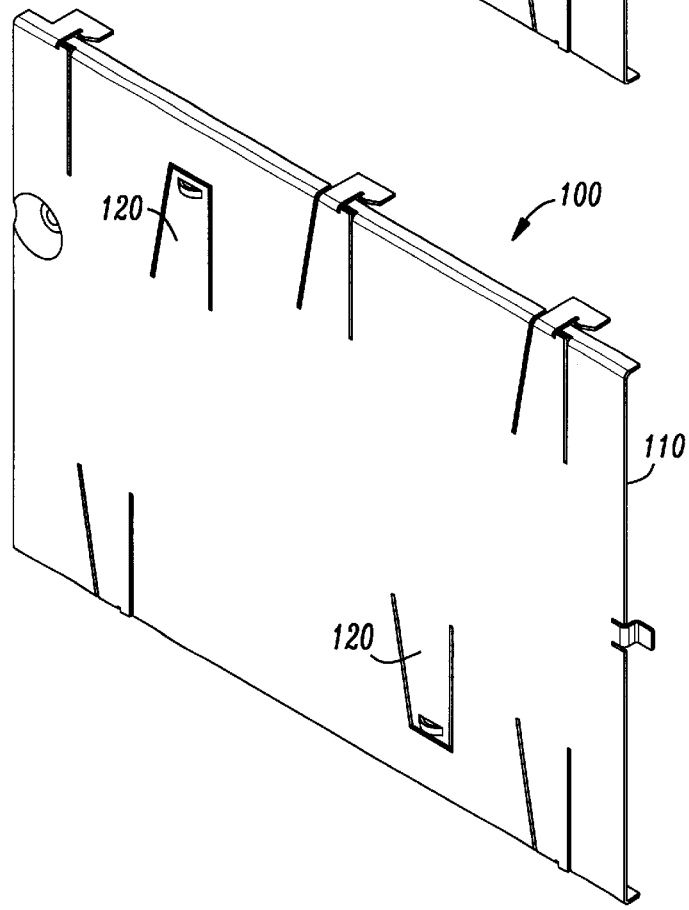
FIG. 1D illustrates an isometric side view on an embodiment of the invention that has two resilient cantilever members on opposing ends of the sidepanel.

Turning now to FIG. 1D, illustrated is an embodiment of the invention with two resilient cantilever members 120 located on opposing ends of the sidepanel 110. Those of ordinary skill in the art will readily understand that any orientation of these two resilient cantilever members 120 on opposing ends of the sidepanel 110 is within the scope of the present invention.

Turning to FIG. 2, illustrated is an isometric view of an electronic module 200 that is configured to be received within the frame of an electronic chassis (not shown). The module 200 has a number of electrical components (not shown) contained within a housing 220. Because the electrical components generate EMI emissions, and the electronics module 200 will be a source of such emissions unless controlled, some EMI control mechanism or technique must be employed. In this instance, the electrical components housing 220 has interlocking sidewalls 230, at least one of which is an EMI module cover 100 as described above. This EMI module cover 100 provides the requisite EMI control by providing electrical contact between the module 200 and an adjacent surface, such as a sidepanel of a chassis or a sidepanel of another module. Those of ordinary skill in the art will readily understand that the EMI module cover 100 can be employed on any surface of the module 200 that will be adjacent to a conductive surface and still be within the scope of the present invention.

Now turning to FIG. 3 illustrated is an electronic equipment chassis 300 configured to receive three electronic modules 200. The chassis 300 has a frame 310 to receive the electronics modules 200, each of which is configured to be received within such frame 310. An examination of this FIG. 3 clarifies how the resilient cantilever members 120 formed from the sidepanel 110 will flex as the module 200 is inserted into the chassis 300. Because the boss 140 on the moveable end 130 of the resilient cantilever member 120 extends outward from the sidepanel 110, a conductive path between the sidepanel 110 and the adjacent conductive surface 320 (not visible) is assured. Those of ordinary skill in the art will understand that the adjacent conductive surface 320 can be on an adjacent module 200 or it can be on the chassis 300 itself.

Turning now to FIG. 4, illustrated is a flow diagram of one embodiment of a method of manufacturing 400 an EMI cover for an electronics module in accordance with the principles of the present invention. The method commences with a start step 410. In a form conductive sidepanel step 420, a conductive sidepanel is formed with a resilient cantilever member formed from the sidepanel. The resilient cantilever member has a fixed end integrally formed with the sidepanel and a movable end free from a module coupler so that the resilient cantilever member can flex as the electronics module is installed in a chassis. In a form boss step 430, a boss is formed proximate the movable end of the resilient cantilever member. The boss is formed so that it extends outwardly from the sidepanel a distance sufficient to provide a conductive path between the conductive sidepanel and an adjacent conductive surface when the module is installed in a chassis. The manufacturing method concludes with an end step 440. Those skilled in the art will readily understand that additional steps covering additional embodiments of the invention can be made and that the steps providing for herein can be modified or changed and still be within the scope of the intended invention.

Although the present invention has been described in detail, those skilled in the art should understand that they can make various changes, substitutions and alterations herein without departing from the spirit and scope of the invention in its broadest form.

What is claimed is:

1. An electronic module configured to be received within a frame of an electronic chassis and capable of generating electromagnetic emissions that cause electromagnetic interference (EMI), comprising;

an electrical component housing having interlocking opposing sidewalls, at least one of said sidewalls being an EMI module cover comprising;

a conductive sidepanel having a resilient cantilever member formed therefrom, said resilient cantilever member having a fixed end integrally formed with said sidepanel and a movable end free of a sidewalls coupler, thereby to allow said resilient cantilever member to flex as said electrical components housing is installed in said electronics chassis; and a boss formed proximate said movable free end and extending outwardly from said sidepanel a distance sufficient to provide a conductive path between said conductive sidepanel and an adjacent conductive surface when said module is installed in said electronic chassis.

2. The electronic module as recited in claim 1 wherein said conductive sidepanel has a plurality of said resilient cantilever members.

3. The electronic module as recited in claim 2 wherein at least one of said resilient cantilever members has an asymmetrical orientation to at least one other of said resilient cantilever members.

4. The electronic module as recited in claim 1 wherein said conductive sidepanel includes two of said resilient cantilever members, said resilient cantilever members located on opposing ends of said conductive sidepanel.

5. The electronic module as recited in claim 1 wherein said cantilever member is formed within a perimeter of said conductive sidepanel.

6. The electronic module as recited in claim 1 wherein said conductive sidepanel further comprises a cantilever member having a fixed end integrally formed with said conductive sidepanel and a movable end having a module coupler.

\* \* \* \* \*